(12) United States Patent
Chung et al.

(10) Patent No.: US 10,256,289 B2
(45) Date of Patent: Apr. 9, 2019

(54) EFFICIENT METAL-INSULATOR-METAL CAPACITOR FABRICATION

(71) Applicant: INTERNATIONAL BUSINESS MACHINES CORPORATION, Armonk, NY (US)

(72) Inventors: Kisup Chung, Albany, NY (US); Isabel C. Estrada-Raygoza, Albany, NY (US); Hemanth Jagannathan, Niskayuna, NY (US); Chi-Chun Liu, Altamont, NY (US); Yann A. M. Mignot, Slingerlands, NY (US); Hao Tang, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/805,829

(22) Filed: Nov. 7, 2017

(65) Prior Publication Data
US 2018/0269274 A1 Sep. 20, 2018

Related U.S. Application Data

(63) Continuation of application No. 15/462,501, filed on Mar. 17, 2017, now Pat. No. 10,090,378.

(51) Int. Cl.
*H01L 49/02* (2006.01)
(52) U.S. Cl.
CPC .................................. *H01L 28/60* (2013.01)
(58) Field of Classification Search
CPC .... H01L 27/10829; H01L 28/40; H01L 28/60
See application file for complete search history.

(56) References Cited

U.S. PATENT DOCUMENTS

| 5,675,184 | A  | 10/1997 | Matsubayashi et al. |
| 5,879,985 | A  | 3/1999  | Gambino et al. |
| 6,358,813 | B1 | 3/2002  | Holmes et al. |
| 6,387,775 | B1 | 5/2002  | Jang et al. |
| 6,461,914 | B1 | 10/2002 | Roberts et al. |
| 6,670,237 | B1 | 12/2003 | Loh et al. |
| 6,706,588 | B1 | 3/2004  | Ning |
| 6,764,915 | B2 | 7/2004  | Lee |
| 7,635,908 | B2 | 12/2009 | Barth et al. |

(Continued)

OTHER PUBLICATIONS

Auth, et. al, "A 22nm High Performance and Low-Power CMOS Technology Featuring Fully-Depleted Tri-Gate Transistors, Self-Aligned Contacts and High Density MIM Capacitors", 2012 Symposium on VLSI Technology Digest of Technical Papers, Jun. 2012, pp. 131-132.

(Continued)

*Primary Examiner* — Quoc Hoang
(74) *Attorney, Agent, or Firm* — Tutunjian & Bitetto, P.C.; Vazken Alexanian

(57) ABSTRACT

Methods of forming capacitors include forming a self-assembled pattern of periodic first and second domains using first and second block copolymer materials over a substrate. The second block copolymer material is etched away. Material from the substrate is etched based on a pattern defined by the first block copolymer material to form cavities in the substrate. A capacitor stack is conformally deposited over the substrate, such that the capacitor stack is formed on horizontal surfaces of the substrate and vertical surfaces of the cavities.

12 Claims, 5 Drawing Sheets

(56) References Cited

U.S. PATENT DOCUMENTS

| | | | |
|---|---|---|---|
| 7,674,675 | B2 | 3/2010 | Berndlmaier et al. |
| 8,993,404 | B2 * | 3/2015 | Kobrinsky ............ H01L 27/224 |
| | | | 438/396 |
| 9,741,817 | B2 * | 8/2017 | Lisiansky ......... H01L 21/76224 |
| 9,818,689 | B1 * | 11/2017 | Zang ................... H01L 23/5223 |
| 2003/0073282 | A1 | 4/2003 | Ning |
| 2003/0231458 | A1 | 12/2003 | Hong et al. |
| 2004/0058504 | A1 | 3/2004 | Keller et al. |
| 2005/0140010 | A1 | 6/2005 | Ning |
| 2007/0166911 | A1 | 7/2007 | Lo et al. |

OTHER PUBLICATIONS

Black, et al., "High-Capacity, Self-Assembled Metal-Oxide-Semiconductor Decoupling Capacitors", IEEE Electron Device Letters, Sep. 2004, pp. 622-624, vol. 25, No. 9.

Cremer, et al., "High Performances 3D Damascene MIM Capacitors Integrated in Copper Back-End Technologies", IEEE BCTM 13.5, Oct. 2006, 4 pages.

Hwang, et al., "Implementation of High Density Embedded 3-Dimensional MIM Capacitor Integrated in Compatible Logic Process", Proceedings of the 2016 28th International Symposium on Power Semiconductor Devices and ICs (ISPSD), Jun. 2016, pp. 431-434.

Jeannot, et al., "Toward Next High Performances MIM Generation: up to 30fF/um2 with 3D Architechture and High-k Materials", IEEE 2007, Dec. 2007, pp. 997-1000.

List of IBM Patents or Patent Applications Treated as Related dated Nov. 7, 2017, 2 pages.

* cited by examiner

US 10,256,289 B2

EFFICIENT METAL-INSULATOR-METAL CAPACITOR FABRICATION

BACKGROUND

Technical Field

The present invention generally relates to capacitor fabrication and, more particularly, to improved processes for fabricating metal-insulator-metal capacitors that use self-assembling block copolymers to increase capacitance per unit area without increasing the number of photomasks needed.

Description of the Related Art

Metal-insulator-metal capacitors are used throughout circuit designs to provide integrated capacitors that can be formed during semiconductor fabrication processes instead of using discrete capacitors on circuit board. However, to increase the capacitance per unit area, additional steps are needed to change the topography of the device. In particular, additional mask steps are often used to provide patterning. These additional mask steps increase process complexity, and hence fabrication costs, as well as potential plasma damage at the interface between metal and dielectric layers.

SUMMARY

A method for forming a capacitor includes forming a self-assembled pattern of periodic first and second domains using first and second block copolymer materials over a substrate. The second block copolymer material is etched away. Material from the substrate is etched based on a pattern defined by the first block copolymer material to form cavities in the substrate. A capacitor stack is conformally deposited over the substrate, such that the capacitor stack is formed on horizontal surfaces of the substrate and vertical surfaces of the cavities.

A method for forming a capacitor includes forming a self-assembled pattern of periodic first and second domains using first and second block copolymer materials over a substrate. The second block copolymer material is etched away. A first mask is formed over the substrate. Material from the substrate is etched in an area exposed by the first mask and the first block copolymer material to form cavities in the substrate. A capacitor stack is conformally deposited over the substrate, such that the capacitor stack is formed on horizontal surfaces of the substrate and vertical surfaces of the cavities. A second mask is formed over the capacitor stack to define a capacitor area. A same lithographic pattern and a developer of opposite polarity is used to form the second mask as is used to form the first mask. The capacitor stack is etched away from areas that are not covered by the second mask.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention use self-assembling block copolymers to define patterning regions before the deposition of metal-insulator-metal capacitor (MIM-CAP) structures that make use of two metal layers with an insulator layer between them. Patterning creates a more complicated topography and increases the surface area of the MIMCAP structures and, hence, the capacitance per unit area. The use of the self-assembling block copolymers removes the need for an extra masking/patterning step to define the patterning regions, thereby decreasing the process complexity.

Figure 1:
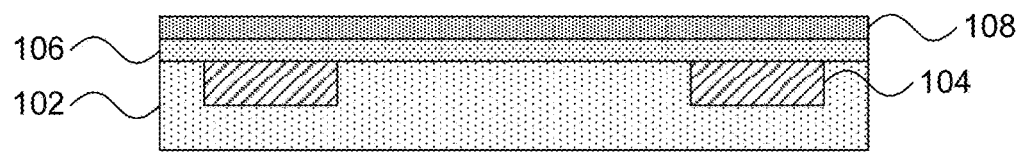
FIG. 1 is a cross-sectional diagram of a step in the formation of a metal-insulator-metal capacitor using block copolymers in accordance with an embodiment of the present invention.

Referring now to FIG. 1, a cross-sectional diagram of a step in the fabrication of MIMCAP structures is shown. Conductive contacts 104 are formed in an inter-layer dielectric 102. It should be understood that, while dielectric materials are particularly contemplated for the interlayer dielectric 102, other substrate materials such as, e.g., polymers, glass, resins, etc. may be used instead. It is specifically contemplated that the interlayer dielectric 102 can be, e.g., silicon dioxide, silicon nitride, or a low-k dielectric such as SiCOH. The conductive contacts may be formed from any appropriate conductive material such as, e.g., tungsten, titanium, tantalum, ruthenium, zirconium, cobalt, copper, aluminum, lead, platinum, tin, silver, or gold.

A hardmask cap is formed from layers 106 and 108 over the interlayer dielectric 102 and the contacts 104. The layer 106 may be formed from an appropriate conductor cap to prevent oxidation of the contacts 104 and may be formed from, e.g., tantalum nitride. The layer 106 may also function as an etch stop layer in some cases. The layer 108 is a hardmask material such as, e.g., silicon nitride, tetraethylorthosilicate oxide, or any other appropriate hardmask material for later topography etching of the interlayer dielectric 102.

Figure 2:
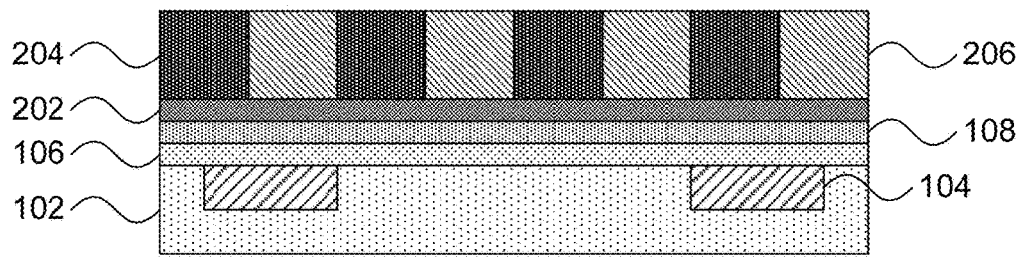
FIG. 2 is a cross-sectional diagram of a step in the formation of a metal-insulator-metal capacitor using block copolymers in accordance with an embodiment of the present invention.

Referring now to FIG. 2, a cross-sectional diagram of a step in the fabrication of MIMCAP structures is shown. A neutral layer 202 is formed over the hardmask layer 108. A layer of self-assembling block copolymer (BCP) is formed over the neutral layer 202 by, e.g., a spin-coating process. An exemplary BCP material is made of two linear and chemically distinct polymer chains covalently bonded together. BCPs can self-assemble into nanoscale structures having dimensions, pitch, and morphology that are determined by the molecular weight of each block, the molecular weight of the BCP molecules, and the ratio of the two blocks, respectively. In the present embodiments, a cylinder forming BCP system may be used, where the first block of the BCP forms matrix domain 204 and the second block of BCP self-assemble in to the minority domain (cylinders) 206. At molecular level, the BCP chains, once annealed, organize themselves in contact with like materials, arranging themselves abutting end-to-end. Thus, each microdomain is about the size of two blocks. In one specific example, the self-assembling material may have one block that is polystyrene, e.g., forming fins 204, and one block that is poly(methyl methacrylate) (PMMA), e.g., forming fins 206.

The neutral layer 202 modifies the surface energy and facilitates the self-assembled structures into vertical cylinders instead of in-plane parallel cylinders, which would have occurred if the substrate had a strong preference to one of the blocks of the BCP. The lengths of the polymer chains can be selected to produce cylinders of diameter between about 10 nm and about 100 nm. In this case, it is specifically contemplated that the self-assembled cylinders may have a center-to-center distance of about 20 nm to about 25 nm. An exemplary annealing condition for self-assembly is a temperature between about 200° C. to about 280° C. for a duration between about 2 minutes and about 300 minutes under ambient atmosphere or a nitrogen atmosphere. The arrangement of the resulting cylinders will be close to a hexagonal array with local grain size ranging from tens to hundreds of nanometers depending on the annealing conditions.

Figure 3:
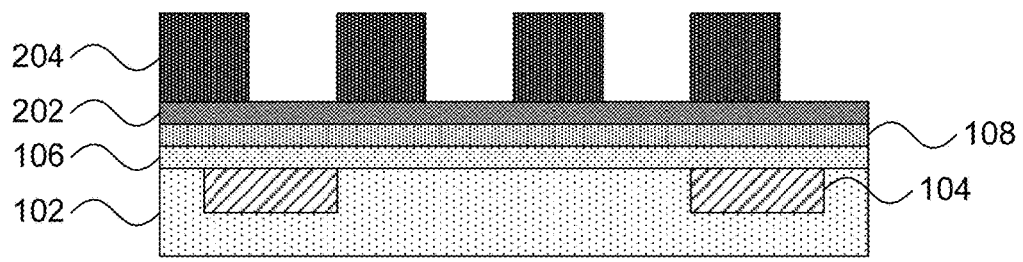
FIG. 3 is a cross-sectional diagram of a step in the formation of a metal-insulator-metal capacitor using block copolymers in accordance with an embodiment of the present invention.

Referring now to FIG. 3, a cross-sectional diagram of a step in the fabrication of MIMCAP structures is shown. One of the self-assembling materials is removed. For example, if polystyrene-PMMA BCPs are used, the PMMA block may be selectively etched with minimum damage to the polystyrene. As used herein, the term "selective" in reference to a material removal process denotes that the rate of material removal for a first material is greater than the rate of removal for at least another material of the structure to which the material removal process is being applied.

Figure 4:
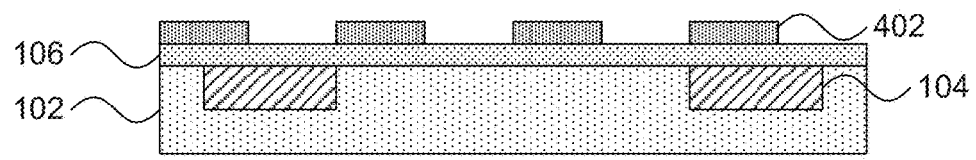
FIG. 4 is a cross-sectional diagram of a step in the formation of a metal-insulator-metal capacitor using block copolymers in accordance with an embodiment of the present invention.

Referring now to FIG. 4, a cross-sectional diagram of a step in the fabrication of MIMCAP structures is shown. The pattern from the remaining polymer structure is transferred to the neutral layer 202 and hardmask layer 108, forming hardmask regions 402. The pattern can be transferred using, e.g., a directional etch such as reactive ion etching (RIE). The remaining polymer material from the first block of self-assembling material 204 and the neutral layer 202 is etched away.

RIE is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation.

Figure 5:
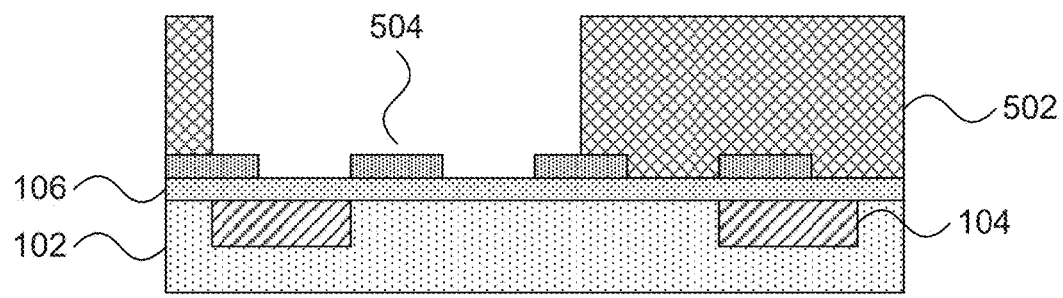
FIG. 5 is a cross-sectional diagram of a step in the formation of a metal-insulator-metal capacitor using block copolymers in accordance with an embodiment of the present invention.

Referring now to FIG. 5, a cross-sectional diagram of a step in the fabrication of MIMCAP structures is shown. A first mask 502 is deposited to define a MIMCAP area 504. In one example, a layer of photoresist material is deposited and is exposed over the MIMCAP area 504. The exposed photoresist material can then be selectively removed. In an alternative embodiment, regions outside the MIMCAP area 504 may be exposed, with the unexposed region being selectively removed.

Figure 6:
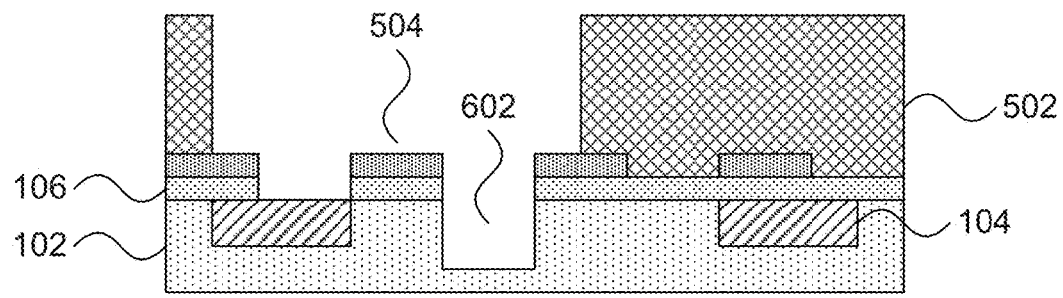
FIG. 6 is a cross-sectional diagram of a step in the formation of a metal-insulator-metal capacitor using block copolymers in accordance with an embodiment of the present invention.

Referring now to FIG. 6, a cross-sectional diagram of a step in the fabrication of MIMCAP structures is shown. The exposed regions of the cap layer 106 are anisotropically etched, exposing one of the conductive contacts 104 and other regions of the interlayer dielectric 102. Exposed regions of the interlayer dielectric 102 are then anisotropically etched to form cavities 602. The cavities 602 are used to provide topographies that will increase the capacitance of MIMCAPs.

It should be understood that an arbitrary number of cavities 602 may be formed to any appropriate depth. The cavities 602 are formed according to the exposed capacitor area 504, so a larger capacitor area 504 (as defined by the mask 502) will result in more cavities. The horizontal area of the cavities, meanwhile, is determined by the length of the block copolymer chains, with longer chains producing larger block structures and, hence, larger cavities 602. The depth of the cavities may be determined according to a timed etch, with a longer etch resulting in deeper cavities 602. It should be understood that the more cavities 602 are included, and the deeper those cavities 602 are, the more vertical surface is provided to increase the capacitance per unit area of the ultimate MIMCAP.

Figure 7:
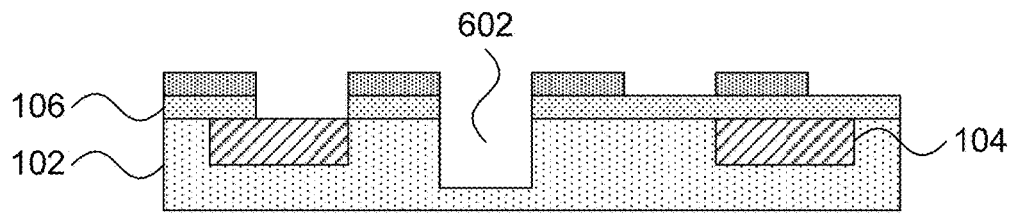
FIG. 7 is a cross-sectional diagram of a step in the formation of a metal-insulator-metal capacitor using block copolymers in accordance with an embodiment of the present invention.

Referring now to FIG. 7, a cross-sectional diagram of a step in the fabrication of MIMCAP structures is shown. The mask 502 is removed, followed by a wet clean to remove any residues or oxides that may remain on the exposed conductive material surfaces.

Figure 8:
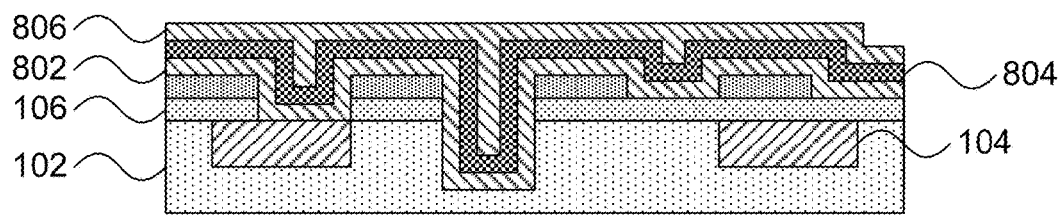
FIG. 8 is a cross-sectional diagram of a step in the formation of a metal-insulator-metal capacitor using block copolymers in accordance with an embodiment of the present invention.

Referring now to FIG. 8, a cross-sectional diagram of a step in the fabrication of MIMCAP structures is shown. A first metal layer 802 is formed on the surface. The first metal layer 802 may be formed from any appropriate conductive metallic material. It is specifically contemplated that the first metal layer 802 may be formed from, e.g., titanium nitride, although other materials may be used if they will react with oxygen to form an insulating barrier layer. The first metal layer 802 may be formed by any appropriate process including, e.g., chemical vapor deposition (CVD), physical vapor deposition (PVD), or atomic layer deposition (ALD).

CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface.

A dielectric layer 804 is deposited on the first metal layer 802 using any appropriate process including, e.g., CVD, PVD, or ALD. The dielectric layer 804 may be formed from any appropriate dielectric material, but is specifically contemplated as being a high-k dielectric material such as, e.g., hafnium dioxide, zirconium dioxide, aluminum oxide, tantalum oxide, and multilayers thereof. As used herein, the term "high-k" refers to a dielectric material having a dielectric constant k that is higher than that of silicon dioxide.

A second metal layer 806 is deposited on top of the dielectric layer 804. It is specifically contemplated that the second metal layer 806 may be formed from, e.g., titanium nitride, although any other material may be used instead. It is furthermore contemplated that the second metal layer 806 will be formed from the same material as the first metal layer 802, although in some embodiments these two materials may differ. The second metal layer 806 may be formed by any appropriate deposition process including, e.g., CVD, PVD, or ALD.

The first metal layer 802, dielectric layer 804, and second metal layer 806 are formed conformally over the topography of the surface. This vertical extension effectively increases the capacitance of the resulting capacitor without increasing the horizontal surface area consumed by the device. Because capacitance for a capacitor generally increases with increased surface area between two conductive plates, the topographical convolutions created by the cavities provide vertical surfaces for capacitance in addition to the horizontal surfaces.

Figure 9:
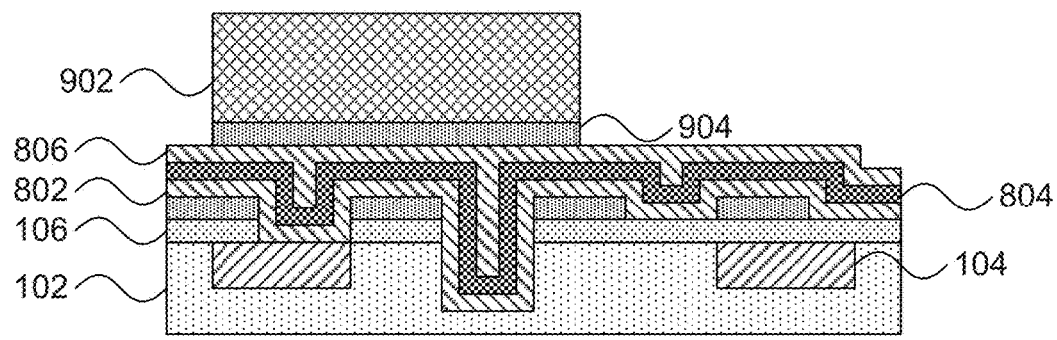
FIG. 9 is a cross-sectional diagram of a step in the formation of a metal-insulator-metal capacitor using block copolymers in accordance with an embodiment of the present invention.

Referring now to FIG. 9, a cross-sectional diagram of a step in the fabrication of MIMCAP structures is shown. A protective layer 904 is formed on the capacitor area and a mask 902 is formed over the protective 904. In this case the same mask and material may be used as was used for the first mask 502, but a developer of the opposite tone may be used (e.g., removing the unexposed region where the exposed region was removed in FIG. 5, or removing the exposed region if the unexposed region was removed in FIG. 5). The result is that the mask 902 is in the same location as the open capacitor area 504 formed by the first mask 502.

The protective layer 904 protects the underlying portions of the MIM stack from damage during the definition of the mask 902 and the subsequent etching of the MIM stack outside of the area protected by the mask 902. Thus the protective layer 904 may be any appropriate material that has etch selectivity with respect to the mask 902 and the second metal layer 806.

Figure 10:
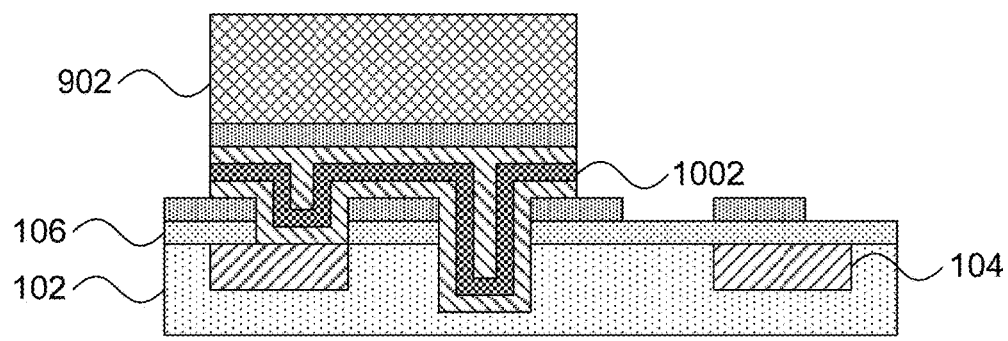
FIG. 10 is a cross-sectional diagram of a step in the formation of a metal-insulator-metal capacitor using block copolymers in accordance with an embodiment of the present invention.

Referring now to FIG. 10, a cross-sectional diagram of a step in the fabrication of MIMCAP structures is shown. The first metal layer 802, dielectric layer 804, and second metal layer 806 are etched away in the areas around the second mask 902, leaving behind MIMCAP 1002. Any appropriate anisotropic etch or combination of etches may be used to remove this material, said etches selectively removing the metal and dielectric layers without affecting the hardmask regions 402 or the underlying cap layer 106.

Figure 11:
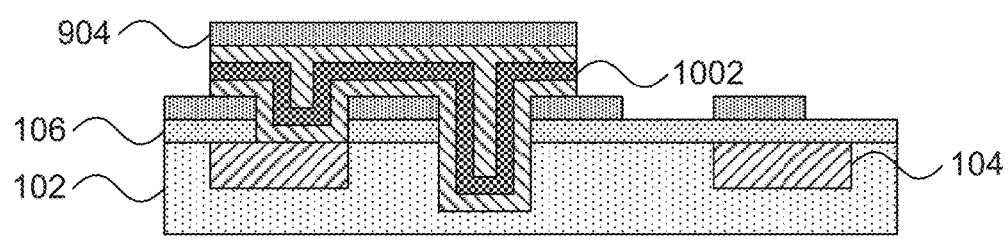
FIG. 11 is a cross-sectional diagram of a step in the formation of a metal-insulator-metal capacitor using block copolymers in accordance with an embodiment of the present invention.

Referring now to FIG. 11, a cross-sectional diagram of a step in the fabrication of MIMCAP structures is shown. The mask 902 is removed, leaving the hardmask 904 over the MIMCAP 1002.

Figure 12:
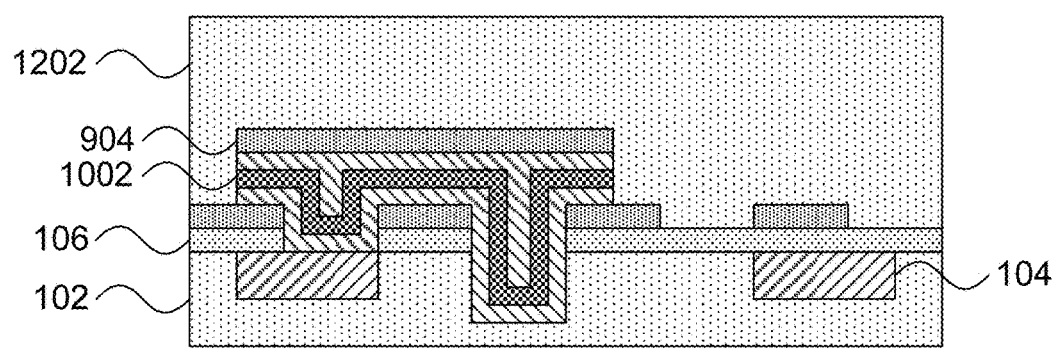
FIG. 12 is a cross-sectional diagram of a step in the formation of a metal-insulator-metal capacitor using block copolymers in accordance with an embodiment of the present invention.

Referring now to FIG. 12, a cross-sectional diagram of a step in the fabrication of MIMCAP structures is shown. After the exposed surfaces are cleaned using, e.g., a wet clean, a layer of dielectric material 1202 is deposited over the MIMCAP 1002 and surrounding structures. The layer of dielectric material 1202 may be, e.g., a low-k dielectric material and may be the same material as the interlayer dielectric 102. Any appropriate deposition process may be used to form the layer of dielectric material 1202 including, e.g., CVD, ALD, or PVD.

Once the layer of dielectric material 1202 is deposited, the top surface may be planarized using, e.g., chemical mechanical planarization (CMP). CMP is performed using, e.g., a chemical or granular slurry and mechanical force to gradually remove upper layers of the device. The slurry may be formulated to be unable to dissolve, for example, the work function metal layer material, resulting in the CMP process's inability to proceed any farther than that layer.

Figure 13:
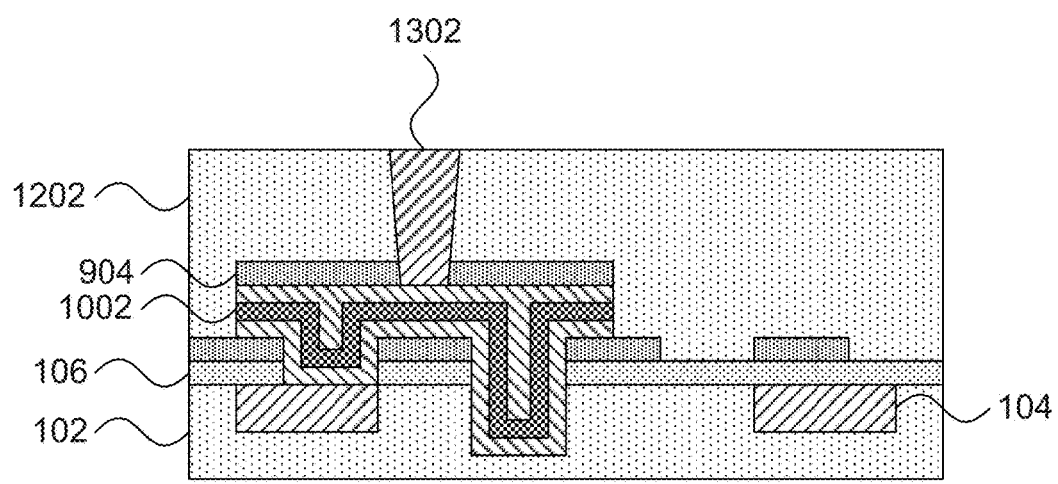
FIG. 13 is a cross-sectional diagram of a step in the formation of a metal-insulator-metal capacitor using block copolymers in accordance with an embodiment of the present invention.

Referring now to FIG. 13, a cross-sectional diagram of a step in the fabrication of MIMCAP structures is shown. A new mask is used to pattern an opening in the layer of dielectric material 1202 and a contact 1302 is formed therein. The contact 1302 may be formed from any appropriate conductive material and may, in particular, be formed from the same material as the conductive contacts 104. It should be understood that two masks are therefore used—a first mask that is used twice two define the capacitor area and a second mask that is used to define the top contact 1302. No additional material is needed to change the topography that is provided by the cavities 602.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features could then be oriented "above" the other elements or features. Thus, the term "below" can encompass both an orientation of above and below. The device can be otherwise oriented (rotated 90 degrees or at other orientations and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 14:
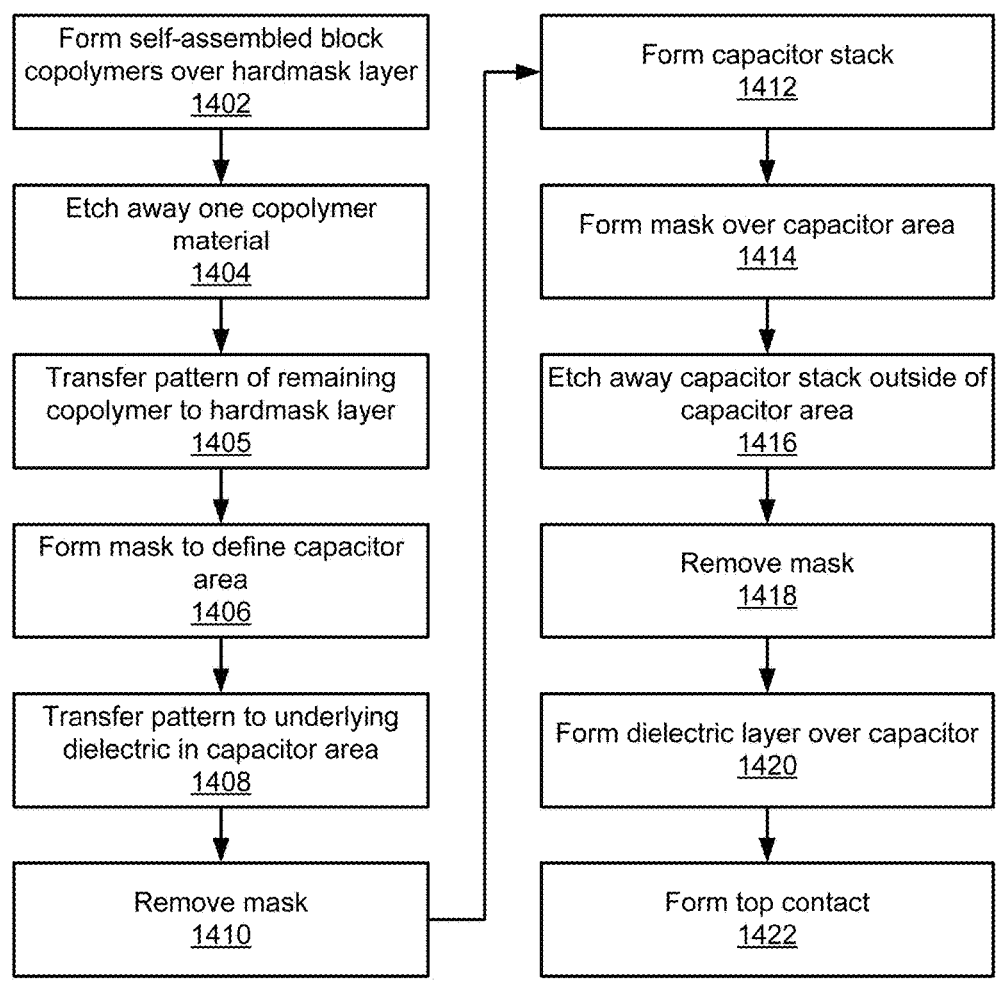
FIG. 14 is a block/flow diagram of a method of forming a metal-insulator-metal capacitor using block copolymers in accordance with an embodiment of the present invention.

Referring now to FIG. 14, a method of forming a MIMCAP is shown. Block 1402 forms self-assembled nanoscale domains 204 and 206 over a hardmask layer 108 which, in turn, lies over a dielectric layer 102 with conductive contacts 104 embedded therein. The self-assembled domains 204 and 206 are formed by block copolymer chains having two blocks on each chain that comprise distinct chemical compositions. Upon annealing, the BCP molecules rearrange where like ends of different molecules form in groups, resulting in periodic structures.

Block 1404 etches away one of the copolymer materials. In particular, minority domain 206 is etched away, leaving the other material in place. Block 1405 transfers the resulting pattern to hardmask layer 108 to form hardmask regions 402. The transfer of the pattern may be performed using an anisotropic etch that selectively removes material from the hardmask layer 108.

Block 1406 forms mask 502 that defines capacitor area 504. Block 1408 transfers the pattern in the exposed capacitor area 504 down into the dielectric layer 102, exposing at least one conductive contact 104 and creating cavities 602. Block 1410 removes the mask 502.

Block 1412 forms the MIMCAP capacitor stack, including a first metal layer 802, a dielectric layer 804, and a second metal layer 806. The capacitor stack is formed without patterning steps between layers, thereby minimizing plasma damage on the interfaces and improving device yield.

Block 1414 forms mask 902 over the capacitor area 504, for example using the same lithographic mask as was used in block 1406 but with a developer of an opposite polarity. Block 1416 anisotropically etches away the layers of the capacitor stack outside of the capacitor area 504. Block 1418 removes the mask 902. After the capacitor 1002 is formed, block 1420 deposits a layer of dielectric material 1202. The layer of dielectric material 1202 may be deposited by any appropriate process such as, e.g., CVD, ALD, or PVD, and then planarized using, e.g., CMP. Block 1422 forms an opening in the layer of dielectric material 1202 and hardmask 904 using, e.g., an appropriate mask and an anisotropic etch. Block 1422 then forms top contact 1302 in the opening to complete the capacitor.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a capacitor, comprising:
   forming a self-assembled pattern of periodic first and second domains using first and second block copolymer materials over a substrate that includes an embedded bottom contact;
   etching away the second block copolymer material;
   etching material from the substrate based on a pattern defined by the first block copolymer material to form a cavity in the substrate to a depth below a top surface of the embedded bottom contact; and
   conformally depositing a capacitor stack over the substrate, such that the capacitor stack is formed in contact with the embedded bottom contact and vertical surfaces of the cavity.

2. The method of claim 1, further comprising forming a mask over the capacitor stack to define a capacitor area and etching away the capacitor stack from areas that are not covered by the mask.

3. The method of claim 2, further comprising forming a mask over the substrate before etching material from the substrate to limit an etched area.

4. The method of claim 3, wherein forming the mask over the capacitor stack and forming the mask over the substrate comprise lithographically defining the respective masks using a same lithographic pattern and developers of opposite polarity.

5. The method of claim 1, further comprising depositing a layer of dielectric material over the capacitor stack.

6. The method of claim 5, forming a top conductive contact through the layer of dielectric material to contact the capacitor stack.

7. The method of claim 1, wherein the first block copolymer material is polystyrene and the second block copolymer material is poly(methyl methacrylate).

8. A method for forming a capacitor, comprising:
   forming a self-assembled pattern of periodic first and second domains using first and second block copolymer materials over a substrate that includes an embedded bottom contact;
   etching away the second block copolymer material;
   forming a first mask over the substrate;
   etching material from the substrate in an area exposed by the first mask and the first block copolymer material to form cavities in the substrate to a depth below a top surface of the embedded bottom contact;
   conformally depositing a capacitor stack over the substrate, such that the capacitor stack is formed in contact with the bottom contact and vertical surfaces of the cavities;
   forming a second mask over the capacitor stack to define a capacitor area, wherein a same lithographic pattern and a developer of opposite polarity is used to form the second mask as is used to form the first mask; and
   etching away the capacitor stack from areas that are not covered by the second mask.

9. The method of claim 8, further comprising depositing a protective layer over the capacitor stack before forming the second mask.

10. The method of claim 8, further comprising depositing a layer of dielectric material over the capacitor stack.

11. The method of claim 10, forming a top conductive contact through the layer of dielectric material to contact the capacitor stack.

12. The method of claim 8, wherein the first block copolymer material is polystyrene and the second block copolymer material is poly(methyl methacrylate).

* * * * *